(12) United States Patent
Feldman et al.

(10) Patent No.: US 12,038,478 B2
(45) Date of Patent: Jul. 16, 2024

(54) HYBRID SOLVER FOR INTEGRATED CIRCUIT DIAGNOSTICS AND TESTING

(71) Applicant: Palo Alto Research Center Incorporated, Palo Alto, CA (US)

(72) Inventors: Aleksandar B. Feldman, Santa Cruz, CA (US); Johan de Kleer, Los Altos, CA (US); Alexandre Campos Perez, San Mateo, CA (US); Ion Matei, Mountain View, CA (US)

(73) Assignee: Xerox Corporation, Norwalk, CT (US)

( * ) Notice: Subject to any disclaimer, the term of this patent is extended or adjusted under 35 U.S.C. 154(b) by 53 days.

(21) Appl. No.: 17/855,012

(22) Filed: Jun. 30, 2022

(65) Prior Publication Data

US 2024/0003970 A1   Jan. 4, 2024

(51) Int. Cl.
*G01R 31/3183* (2006.01)
*G01R 31/317* (2006.01)
G01R 31/3177 (2006.01)
G01R 31/3185 (2006.01)
G06F 17/10 (2006.01)
H04L 1/20 (2006.01)

(52) U.S. Cl.
CPC ............... *G01R 31/318307* (2013.01); *G01R 31/31704* (2013.01); *G01R 31/318314* (2013.01); *G01R 31/31709* (2013.01); *G01R 31/3177* (2013.01); *G01R 31/318547* (2013.01); *G01R 31/318558* (2013.01); *G06F 17/10* (2013.01); *H04L 1/205* (2013.01)

(58) Field of Classification Search
CPC ...... G01R 31/318547; G01R 31/31709; G01R 31/318558; G01R 31/3177; G01R 31/318307; G01R 31/31704; G01R 31/318314; G06F 17/10; H04L 1/205
See application file for complete search history.

(56) References Cited

U.S. PATENT DOCUMENTS

| | | | |
|---|---|---|---|
| 2006/0236186 A1* | 10/2006 | Wang | G01R 31/318335 714/738 |
| 2007/0179760 A1* | 8/2007 | Smith | G06F 30/00 703/2 |
| 2008/0195982 A1* | 8/2008 | Nahir | G01R 31/318364 716/106 |
| 2021/0303915 A1* | 9/2021 | Mandal | G06F 18/2433 |
| 2022/0222042 A1* | 7/2022 | Yamaguchi | G06N 5/01 |

* cited by examiner

*Primary Examiner* — April Y Blair
*Assistant Examiner* — Sazzad Hossain

(57) ABSTRACT

One embodiment provides a method and a system for computing diagnoses for a physical system. During operation, the system can obtain a design of the physical system, generate a design of a diagnostic system by augmenting the design of the physical system based on a number of fault-emulating subsystems, and convert the design of the diagnostic system into a polynomial formula comprising a plurality of variables. The plurality of variables can include inputs and outputs of the original physical system and a number of ancillary variables. The system can further embed the polynomial formula on a hardware-based solver configured to perform optimization using the polynomial formula as an objective function to obtain a diagnostic vector used for explaining faults in the physical system.

20 Claims, 7 Drawing Sheets

$$f(i_1, i_2, c_i, \sigma, c_o, z_1, z_2, z_3)$$
$$= 2z_1 - i_1 i_2 - 2i_1 i_2 z_1 + 2z_2 + i_1 + i_2$$
$$- 2i_1 z_2 - 2i_2 z_2 + 4i_1 i_2 z_2 + 2z_3 - c_i z_2$$
$$- 2c_i z_2 z_3 + \sigma + c_i - 2\sigma z_2 - 2c_i \sigma$$
$$+ 4c_i \sigma z_2 + c_o - z_1 z_3 - 2c_o z_1 - 2c_o z_3$$
$$+ 2c_o z_1 z_3$$

HYBRID SOLVER FOR INTEGRATED CIRCUIT DIAGNOSTICS AND TESTING

BACKGROUND

Field

This disclosure is generally related to fault diagnostics and synthesis of digital circuits. More specifically, this disclosure is related to a hybrid solver that converts a diagnostic or design problem of a digital system to the problem of minimizing a system of multilinear polynomials and then solves the polynomial-minimization problem.

Related Art

Digital integrated circuits (ICs) are ubiquitous in people's lives, from washing machines to spaceships. Advances in lithography technologies have enabled the feature size of the circuits to decrease continuously, thus facilitating the development of high-density ICs. However, as the feature size decreases, defects (e.g., due to impurities in the substrate, misalignments of masks, trembling during exposure, etc.) in ICs become more common and can lead to the malfunction of the circuits. Testing of the ICs is an important step to ensure the quality of the final product comprising the ICs. The increasing complexity of the ICs also increases the cost of testing. It is estimated that testing and fault-diagnosis costs can be up to 40% of the total production cost of modern digital ICs. It is desirable to have mechanisms that can solve testing and diagnostic problems efficiently and is scalable.

SUMMARY

One embodiment provides a method and a system for generating diagnosis vectors of a to-be-diagnosed computational system. During operation, the system can obtain a design of the computational system, generate a design of a diagnostic system by augmenting the design of the computational system based on a number of fault-emulating subsystems, and convert the design of the diagnostic system into a polynomial formula comprising a plurality of variables. The plurality of variables can include inputs and outputs of the original system and a number of ancillary variables. The system can further embed the polynomial formula on a hardware-based solver configured to perform optimization using the polynomial formula as an objective function to obtain a diagnostic vector used for explaining faults in the to-be-diagnosed computational system.

In a variation on this embodiment, the computational system can include a plurality of logic gates, and converting the design of the diagnostic system into the polynomial formula can include representing each logic gate using a corresponding polynomial.

In a variation on this embodiment, the system can split the to-be-diagnosed computational system into a plurality of subsystems by implementing a cube-and-conquer technique, thereby facilitating parallel processing.

In a variation on this embodiment, converting the design of the diagnostic system can include reducing an order of the polynomial formula to obtain a quadratic polynomial formula.

In a further variation, reducing the order of the polynomial formula can include determining an occurrence frequency of a product of a k-tuple of variables, determining a ranking of the k-tuple of variables based on the occurrence frequency of the product, and in response to determining that the ranking is higher than a predetermined ranking, introducing an additional ancillary variable to replace the product of the pair of variables.

In a variation on this embodiment, the system can further map the polynomial formula to a formula embeddable on the hardware-based solver, and mapping the polynomial formula to the embeddable formula can include solving a graph isomorphism problem.

In a variation on this embodiment, the hardware-based solver can include an Ising machine.

One embodiment can provide non-transitory computer-readable storage medium storing instructions that when executed by a computer cause the computer to perform a method for generating test vectors for a computational system. The method can include obtaining a design of the computational system; generating a design of a test system by augmenting the design of the computational system based on a number of fault-emulating subsystems; converting the design of the test system into a polynomial formula comprising a plurality of variables, wherein the plurality of variables comprise inputs and outputs of the original system and a number of ancillary variables; and embedding the polynomial formula on a hardware-based solver configured to perform optimization using the polynomial formula as an objective function to obtain a set of test vectors used for testing potential faults in the computational system.

One embodiment can provide a hybrid system for generating diagnoses for a digital circuit. The hybrid system can include a receiving module configured to receive a design of the digital circuit, a circuit-augmentation module configured to generate a design of a fault-augmented diagnostic or test circuit by augmenting the design of the digital circuit based on a number of fault-emulating subcircuits, and a circuit-conversion module configured to convert the design of the fault-augmented or test circuit into a polynomial formula comprising a plurality of variables. The plurality of variables can include inputs and outputs of the original system and a number of ancillary variables. The hybrid system can further include a hardware-based solver configured to perform optimization using the polynomial formula as an objective function to obtain a diagnostic vector used for explaining faults or a set of test vectors used for testing potential faults in the digital circuit.

BRIEF DESCRIPTION OF THE FIGURES

In the figures, like reference numerals refer to the same figure elements.

DETAILED DESCRIPTION

Figure 1:
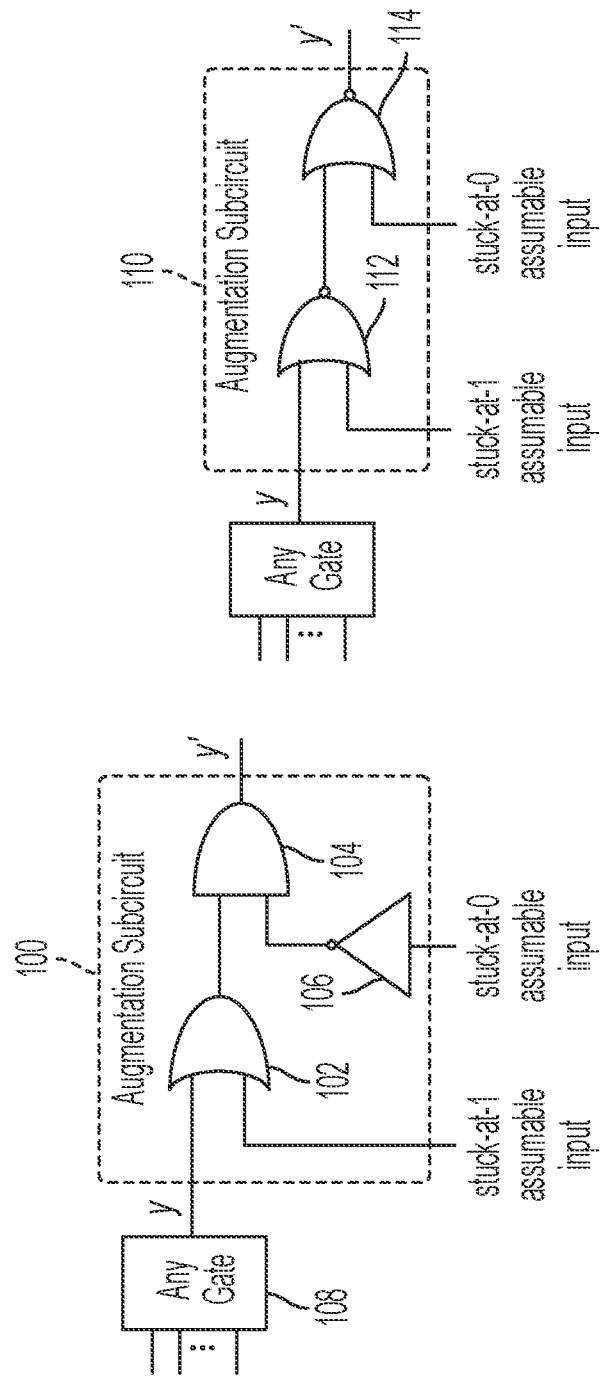
FIG. 1A illustrates an exemplary implementation of augmenting a circuit design for diagnosing stuck-at faults, according to one embodiment.
FIG. 1B illustrates an exemplary implementation of augmenting a circuit design for diagnosing stuck-at faults, according to one embodiment.

The following description is presented to enable any person skilled in the art to make and use the embodiments and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown but is to be accorded the widest scope consistent with the principles and features disclosed herein.

Overview

Embodiments described herein provide a system and method for computing diagnoses and generating test patterns for digital and analog integrated circuits (ICs) or for design of digital or analog ICs and other physical systems. More specifically, a hybrid solver comprising a plurality of software modules and hardware-based solvers can be used to solve the circuit-diagnostic or circuit-synthesis problem. The software modules can include modules for translating a high-level circuit-diagnostic or circuit-synthesis problem into a satisfiability (SAT) problem, modules for splitting a large circuit-SAT problem into multiple smaller problems to facilitate parallel processing, modules for preprocessing (e.g., converting the SAT problem to the problem of minimizing polynomials and reducing the order of the polynomials), and modules for mapping the polynomials to a format that is implementable or embeddable on the underlying hardware solvers. The underlying hardware solvers can include quantum-computing devices (e.g., D-wave devices or Ising machines).

Computational Models for Circuit-Diagnostic Problems

A circuit-diagnostic problem can include two essential parts: a circuit $\varphi$ and an assignment a to its primary inputs and outputs. The goal is to compute an assignment to a set of special assumable inputs that drive fault-modes. The assignment should not lead to a contradiction in $\varphi \wedge \alpha$ and should have the smallest number of fault values, which can be positive values by convention.

In some embodiments, modeling of the faults can be achieved through fault augmentation, where an original circuit can be converted into a fault-augmented diagnostic circuit by including subcircuits that emulate possible faults (e.g., stuck-at-1 and stuck-at-0 faults). Although the stuck-at faults are commonly tested by conventional testing systems, other types of faults can also be included, such as the wrong-component-type faults (e.g., a supposedly OR gate behaves like an AND gate or vice versa), the connection-failure faults (e.g., an open wire), the bridging faults (e.g., a shorted connection to the ground or other wires), etc. Potential faults can be emulated by augmenting the original circuit design using a number of standard components (e.g., logic gates). The fault-augmented diagnostic circuit design can have the same set of primary inputs and outputs as the original circuit design and can include a new set of assumable inputs, which allow a simulation system to simulate the effect of a fault by assigning values to the assumable inputs.

FIG. 1A illustrates an exemplary implementation of augmenting a circuit design for diagnosing stuck-at faults, according to one embodiment. In FIG. 1A, augmentation subcircuit 100 can include an AND gate 102, an OR gate 104, and an inverter 106. When augmentation subcircuit 100 is coupled to the output of a logic gate 108 (which can be any type of logic gate), it can simulate a stuck-at fault occurring at logic gate 108. When the stuck-at-1 assumable input (which is coupled to AND gate 102) is set as 1, the output of augmentation subcircuit 100 will always be 1, regardless of the status of the coupled gate (i.e., logic gate 108). Similarly, when the stuck-at-0 assumable input (which is coupled to inverter 106) is set as 1, the output of augmentation subcircuit 100 will always be 0, regardless of the status of the coupled gate (i.e., logic gate 108). Hence, by setting the stuck-at-1 or stuck-at-0 assumable input, one can emulate, respectively, the stuck-at-1 or stuck-at-0 fault at the coupled gate.

FIG. 1B illustrates an exemplary implementation of augmenting a circuit design for testing stuck-at faults, according to one embodiment. In FIG. 1B, augmentation subcircuit 110 can include NOR gates 112 and 114, with the stuck-at-1 assumable input coupled to NOR gate 112 and the stuck-at-0 assumable input coupled to NOR gate 114. Note that augmentation subcircuit 100 and augmentation subcircuit 110 are logically equivalent to each other, meaning that for every combination of primary inputs the two circuits produce matching primary outputs. Also note that the number of gates in augmentation subcircuit 110 is fewer than the number of gates in augmentation subcircuit 100. The reduced number of gates can increase the computational efficiency when generating the diagnoses (i.e., identifying the faulty component), considering that an augmentation subcircuit will need to be inserted at the output of each gate in the circuit and at each primary input in order to simulate all possible fault behaviors in the circuit.

SAT solvers have been used in previous approaches to solve the circuit-test problem (i.e., to determine the shortest possible sequence of test vectors that can test every possible fault in the circuit, this problem is also known as the automatic test pattern generation (ATPG) problem) or the circuit-diagnostic problem (i.e., to determine faulty component or components in the circuit) using the fault-augmented test or diagnostic circuit, where the circuit-test or circuit-diagnostic problem can be converted to the problem of solving a Boolean formula. However, such approaches can be slow and do not scale well. There lack diagnosis and test-pattern-generation mechanisms that can automatically diagnose and generate test patterns for large-scale digital ICs (e.g., ICs having thousands or millions of components).

In some embodiments, instead of converting the fault-augmented test circuits to Boolean formulas or circuits, a fault-augmented test or diagnostic circuit can be converted to multilinear polynomials such that the SAT problem can be converted to a multi-objective optimization problem, which can be represented as min $(f_1(\vec{x}), f_2(\vec{x}), \ldots, f_k(\vec{x}))$, s.t., $\vec{x} \in X$, where $k \geq 2$, $f_1(\vec{x}), f_2(\vec{x}), \ldots, f_k(\vec{x})$ are objective functions, and set X is the feasible set defined by some constraint functions. To do so, instead of using a Boolean function to represent a logic gate (e.g., using the conjunction logic for an AND gate), one can use a polynomial to represent each logic gate, where the correct input-output behavior of the logic gate minimizes the value of the polynomial. For example, an AND gate can be represented using a polynomial $o + \Pi_{j=1}^{n} i_j - 2o \Pi_{j=1}^{n} i_j$, where o is the output and $i_j$ is the $j^{th}$ input. The polynomial representation of different types of logic gate can be found in Table I below.

TABLE I

| GATE | POLYNOMIAL |
|---|---|
| AND | $o + \prod_{j=1}^{n} i_j - 2o\prod_{j=1}^{n} i_j$ |
| OR | $o + \sum_{j=1}^{n} i_j - \prod_{j=1}^{n} i_j - 2o\sum_{j=1}^{n} i_j + 2\prod_{j=1}^{n} i_j$ |
| XOR | $o + i_1 + i_2 - 2i_1i_2 - 2oi_1 - 2oi_2 + 4oi_1i_2$ |
| XNOR | $1 - o - i_1 - i_2 + 2i_1i_2 + 2oi_1 + 2oi_2 - 4oi_1i_2$ |
| NOT | $1 - o - i + 2oi$ |

Figure 2:
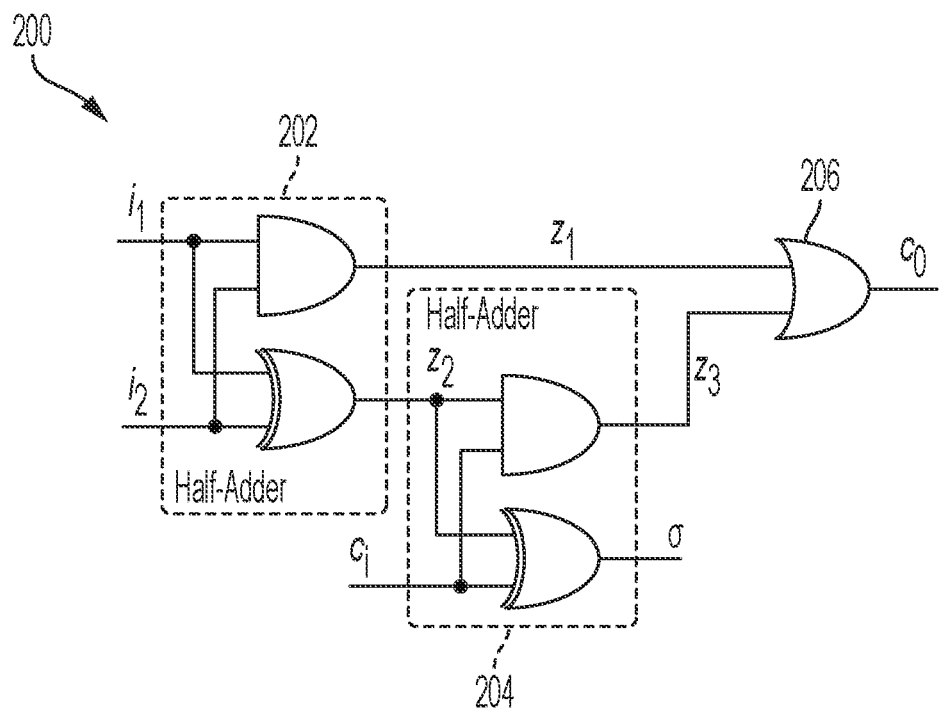
FIG. 2 illustrates a full-adder circuit and a corresponding polynomial, according to one embodiment.

Note that there are infinitely many ways to represent a logic gate using a polynomial. The expressions shown in Table I are exemplary. To convert a circuit design to a polynomial, ancillary variables can be introduced at each output of each gate, and each gate can be translated into a polynomial according to Table I. The resulting polynomials are simply summed to form the final result that represents the circuit. FIG. 2 illustrates a full-adder circuit and a corresponding polynomial, according to one embodiment. In FIG. 2, full-adder circuit 200 can include half-adder circuits 202 and 204 and an OR gate 206. In addition to input and output variables, ancillary variables (i.e., $z_1$, $z_2$, and $z_3$) have been introduced in the polynomial. As can be seen from FIG. 2, the number of ancillary variables increases linearly with the number of gates, and the polynomial can include higher-order (equal to or greater than three) terms. In FIG. 2, the third-order terms are each surrounded by a dashed box.

Figure 3:
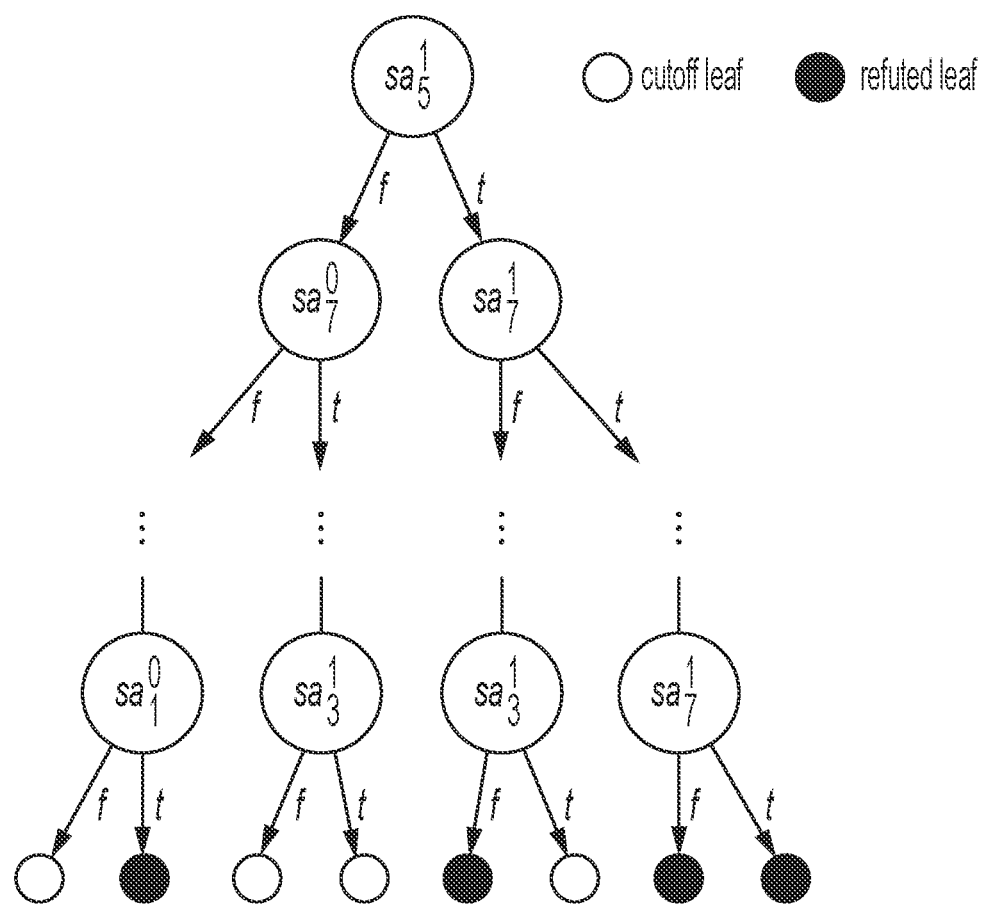
FIG. 3 illustrates an exemplary search process for splitting a large circuit into multiple smaller circuits, according to one embodiment.

To reduce the number of ancillary variables, in some embodiments, a large circuit can be divided into a number of smaller circuits (also referred to as subcircuits) based on Shannon expansion. A cube-and-conquer technique can be used to divide the large circuit. For example, a SAT solver can use advanced heuristics to construct a search tree. A path from the root node to a leaf node signifies either a conflict or a partial assignment for which more work is necessary. While conflicts are discarded, each partial assignment can be used for circuit simplification, resulting in multiple smaller subcircuits. A circuit is SAT if and only if one of its simplified subcircuits is SAT. The size of each simplified subcircuit can be adjustable by setting the number of partially assigned variables. In addition to cube-and-conquer, other parallel SAT solving techniques can be used, including but not limited to knowledge compilation and binary decision diagrams (BDDs). To prevent the number of splits from increasing exponentially, various variable heuristics can be used. For example, look-ahead SAT heuristics can be used to select variables or branches that are visited most frequently to build subcircuits. In addition, a greedy graph-partitioning technique can be used to divide the search tree. FIG. 3 illustrates an exemplary search process for splitting a large circuit into multiple smaller circuits, according to one embodiment. Note that the assignment (f or t) can be made at each node. At the leaf nodes, each black circle indicates a conflict, and each white circle (or a cutoff leaf) results in a call to the underlying hardware-based solver (e.g., a solver based on Ising machines). Different types of Ising machines can be used in the solver, including but not limited to: complementary metal-oxide-semiconductor (CMOS) circuit-based Ising machines, optical Ising machines, optoelectrical Ising machines, superconducting Ising machines, quantum Ising machines, etc.

After splitting the large circuit into a number of smaller subcircuits, each subcircuit can be converted to polynomial unconstrained binary optimization (PUBO) format (such as the polynomial shown in FIG. 2). PUBO formulas can be converted to quadratic unconstrained binary optimization (QUBO) formulas by introducing additional ancillary variables. In some embodiments, conversion from the PUBO format to the QUBO format can include rewriting higher order terms using a penalty function $s(x, y, z)=3z+xy-2xz-2yz$. More specifically, a cubic polynomial term $\alpha x_i x_j x_k$ can become $\alpha x_{ij} x_k + (1+|\alpha|)s(x_i, x_j, x_{ij})$. The order reduction of the cubic term introduces one new ancillary variable $x_{ij}$, three quadratic terms, and one term of order one. Consider a second term $\beta x_i x_j x_m$. Instead of creating a new ancillary variable $x_{ij}'$, it is more efficient to reuse $x_{ij}$. In this case, the joint reduction of $\alpha x_i x_j x_k + \beta x_i x_j x_m$ becomes $\alpha x_{ij} x_k + \beta x_{ij} x_m + (2+|\alpha|+|\beta|)s(x_i, x_j, x_{ij})$, which can create a significant saving in the number of variables.

Choosing k-tuples of variables (in the QUBO example, k=2) for order reduction can be challenging. Minimizing the number of ancillary variables in the PUBO-to-QUBO conversion process is an NP-complete problem (by reduction to Minimal Hitting Sets). In some embodiments, a search tree similar to what is shown in FIG. 3 can be used to identify k-tuples of variables that can share a single ancillary variable. Similar heuristic techniques (e.g., look-ahead or greedy-search) can be used to identify variables to combine during order reduction. For example, the most frequently used variable pairs can be chosen to be replaced by one ancillary variable. In one embodiment, the system can determine the occurrence frequency of the product of each pair of variables and rank the variable pairs based on their occurrence frequencies. Variable pairs with rankings higher than a predetermined ranking (e.g., the top 5 or 10 ranked) can be selected.

Using the fault-augmented test circuit to compute test patterns can include assigning the known observations to the primary inputs and outputs and solving for the assumable inputs (i.e., fault-assumable inputs). To compute minimal diagnoses, a cardinality constraint (e.g., a single-fault constraint or a double-fault constraint) can be added to the assumable inputs. In previous SAT-based approaches, the cardinality constraint often can include a sorting network or a multi-operand adder.

Consider a bitonic sorting network as a cardinality constraint. A bitonic sorting network with n inputs has $O(n \log^2 n)$ comparators, with each comparator containing an AND gate and an OR gate. The outputs of the sorting network are connected to constant values (e.g., 1 for single fault) encoding the desired diagnostic cardinality. SAT-based cardinality encodings can lead to an unnecessary increase in the number of gates and ancillary variables. To mitigate this problem, in some embodiments, the entire sorting network can be represented as a single polynomial term $n^{-1}(f_1+f_2+ \ldots +f_n)$, where $f_1, f_2, \ldots, f_n$ is the set of assumable variables. This constraint not only significantly decreases the number of ancillary variables, but also directly computes a minimal diagnosis instead of using the SAT-based approach of first looking for single-fault diagnoses, then for double-fault ones, etc. This approach also works for SAT problems (e.g., by reverse-engineering the cardinality constraints in the SAT problem). This can be done by pattern matching of clauses in the conjunctive normal form (CNF) or using methods from SAT and model-checking for reverse-engineering subcircuits constituting cardinality constraints. The latter problem can be solved with the help of a miter circuit, a generalized switch, and a classical SAT solver.

According to Table 1, a multilinear polynomial converted from a circuit includes integer coefficients only. Existing approaches for embedding the polynomial multiply each coefficient by a fixed ratio s and add an offset q to match the physical ranges of the couplers of the Ising machines, which can introduce quantization error. Borrowing ideas from information theory, it is possible to view the couplers as a communication channel and the resolution of the couplers as the capacity of the channel. Another analogy is to view the coefficients as code words. Based on the information theory, maximizing the channel utilization requires the entropy of the message to be equal to the channel capacity.

Consider the frequency distribution $A=\{a_i, b_i\}$ of all coefficients of a quadratic polynomial f with n terms ($1 \le i \le m$). This means that coefficient $a_i$ appears $b_i$ times in f. The entropy metric $M_{quboh}$ can be defined as $-\Sigma_{i=0}^{m} p_i \log p_i$, where $p_i = b_i/n$. $M_{quboh}$ is a lower bound on the number of resolution bits needed for mapping the coefficients of f onto the couplers without introducing quantization errors.

Considering, for example, a polynomial $f=x_1x_2+3x_1x_3+9x_2x_3$, the traditional approach requires four bits of precision (to represent coefficient 9) to avoid quantization error. For the simple example above, there exists a polynomial $f'=x_1x_2+3x_1x_3+7x_2x_3$ that has a global minimum for the same values of the arguments $x_1=x_2=-1$, $x_3=1$ and uses only three bits of precision (to represent coefficient 7). In some embodiments, for a given quadratic polynomial f, a minimum preserving polynomial f' can be found, and $M_{quboh}$ of f' is lower than that of f. This can be done by computing selective scalers for each group of terms included in the polynomial of a logic gate. For example, the polynomial translation of an XOR gate is $o+i_1+i_2-2i_1i_2-2oi_1-2oi_2+4oi_1i_2$, and one can multiply all terms by ½ or ¼, preserving the argument values at which the global minimum is achieved.

Choosing the right combination of scalers that minimize $M_{quboh}$ leads to another NP-hard optimization problem. In some embodiments, to deal with the complexity, a greedy method can be implemented to decrease the quantization error at a fraction of the computational cost. The entropy reduction algorithm can be recursively solved using the hybrid solver. The entropy can depend on the circuit topology, the circuit-encoding method, and the tools used for translating the circuit to QUBO formulas. A number of techniques can be used to achieve the QUBO entropy that can be handled by the underlying hardware optimizer (e.g., the Ising machines). For example, the optimal trade-off between the number of ancillary variables and the QUBO entropy can be found. If the QUBO entropy is too large for the hardware optimizer to handle, the original problem can be split differently. The coefficients are scaled to preserve the QUBO formula minimum.

The QUBO formulas obtained from the order reduction may not be able to be implemented by or embedded on the underlying hardware optimizer and have to be mapped to embeddable QUBO formulas. Mapping QUBO formulas to embeddable QUBO formulas (which are equivalent formulas) can be challenging. An optimal mapping requires solving a graph isomorphism problem and adding additional ancillary variables. To find an optimal trade-off, in some embodiments, the graph isomorphism problem can be solved as a SAT problem recursively using the proposed hybrid solver. Alternatively, the underlying SAT problem can be solved using conventional SAT solvers.

A naïve method for converting the graph isomorphism problem to a SAT problem is to construct a Boolean formula with $n^2$ variables where n is the size of each graph. Denoting each variable as $x_{i,j}$, there are three sets of cardinality constraints: (1) for each $1 \le j \le n$, exactly one of $x_{0,j}$, $x_{1,j}, \ldots, x_{n,j}$ is true; (2) for each $1 \le i \le n$, exactly one of $x_{i,1}$, $x_{i,2}, \ldots, x_{i,n}$ is true; and (3) for each edge p,q that is in X and an edge r,s that is not in Y, introduce an at-most-one (a single clause) between $x_{p,q}$ and $x_{r,s}$. This approach for encoding the isomorphism problem will provide enhanced pseudo-Boolean constraints like the ones for solving the diagnostic problem, where a sorting-network cardinality constraint is replaced by a single sum of terms.

The Hybrid Solver

Figure 4:
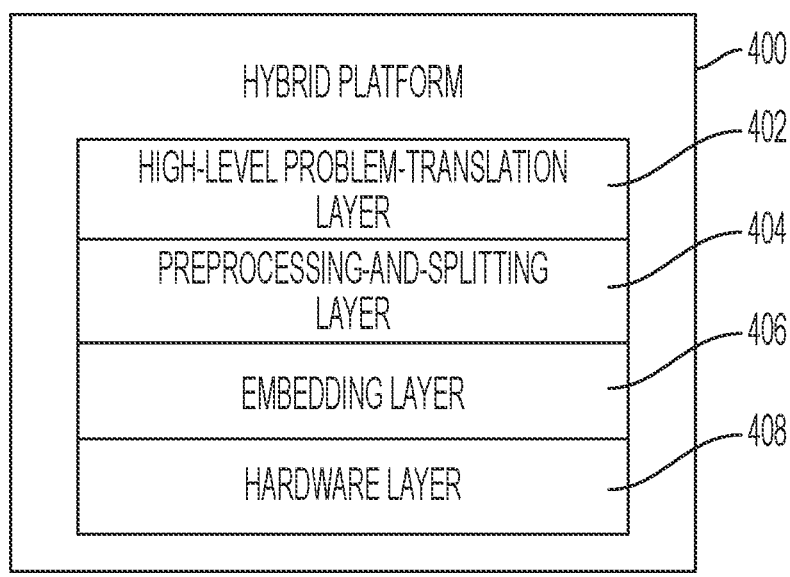
FIG. 4 illustrates an exemplary high-level architecture of a hybrid platform for solving fault-diagnostic problems for large-scale integrated circuits (ICs), according to one embodiment.

FIG. 4 illustrates an exemplary high-level architecture of a hybrid platform for solving fault-diagnostic problems for large-scale IC circuits, according to one embodiment. In FIG. 4, a hybrid platform 400 can include a high-level problem-translation layer 402, a preprocessing-and-splitting layer 404, an embedding layer 406, and a hardware layer 408.

High-level problem-translation layer 402 can translate the high-level circuit-diagnostic problem to a SAT problem. For example, high-level problem-translation layer 402 can include modules responsible for generating a fault-augmented test circuit for a to-be-diagnosed circuit. In alternative embodiments, the problem can be a circuit-synthesis problem, and modules (e.g., software modules) within high-level problem-translation layer 402 can generate a circuit using universal cells and a miter structure. Moreover, the circuit-diagnostic or -synthesis problem can be translated into a simpler format, such as a Boolean satisfiability problem (SAT) or its optimization variation maximum satisfiability problem (MaxSAT). During translation, extra variables (e.g., ancillary variables) and constraints (e.g., cardinality constraints) can be added. Preprocessing-and-splitting layer 404 can include modules for splitting a large circuit into a number of smaller subcircuits and for performing a number of preprocessing steps. Exemplary preprocessing operations can include but are not limited to converting the circuit to polynomials (e.g., PUBO formulas) and reducing the order of the polynomials (e.g., converting the PUBO formulas to QUBO formulas). Embedding layer 406 can be responsible for mapping the polynomials with a reduced order to embeddable polynomials (e.g., mapping the QUBO formulas to embeddable QUBO formulas). Hardware layer 408 can include one or more quantum-computing-based solvers (e.g., D-wave devices or Ising machines) capable of solving polynomial-minimizing problems.

Figure 5:
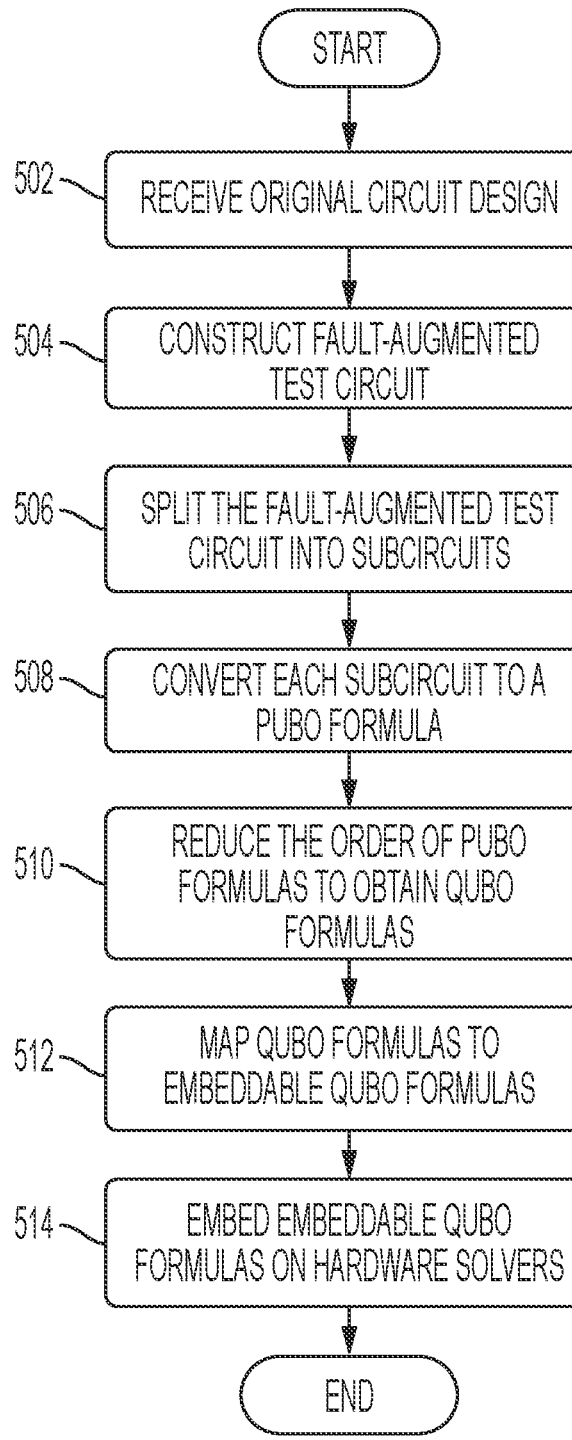
FIG. 5 presents a flowchart illustrating an exemplary process for generating test patterns used for diagnosing faults in a circuit, according to one embodiment.

FIG. 5 presents a flowchart illustrating an exemplary process for generating test patterns used for diagnosing faults in a circuit, according to one embodiment. During operation, the system receives the original circuit design for a to-be-tested digital circuit (operation 502). The received original circuit design is assumed to have no fault (i.e., it is properly designed) and can be in the form of a hardware layout or a netlist. The system can construct a fault-augmented circuit based on the original circuit design and fault-emulating subcircuits included in a pre-established fault library (operation 504). The fault library can include descriptions of subcircuits for emulating different types of faults, including but not limited to: stuck-at faults, wrong-component-type faults, bridging faults, and open-wire faults. Constructing the fault-augmented circuit can include inserting an augmentation subcircuit (e.g., the stuck-at-fault-augmentation subcircuit shown in FIG. 1A or 1B) at the output of each gate in the original circuit and at each primary input of the original circuit. Constructing the fault-augmented circuit can further include applying a cardinality constraint. The fault-augmented circuit can be used to compute the smallest theoretically possible test suite for testing faults in the original circuit. Detailed descriptions regarding computing the test suite using a fault-augmented circuit can be found in U.S. patent application Ser. No. 17/319,835, entitled "METHOD AND SYSTEM FOR EFFICIENT TESTING OF DIGITAL INTEGRATED CIRCUITS," by inventors Aleksandar B. Feldman, Johan de Kleer, Alexandre Perez, and Ion Matei, filed 13 May 2021, the disclosure of which is incorporated herein by reference in its entirety.

Subsequently, the system can split the fault-augmented circuit into multiple smaller subcircuits (operation 506). Splitting the circuit allows for parallel processing where each subcircuit is solved separately. In some embodiments, a cube-and-conquer technique can be used to split the circuit into subcircuits. This way, a large problem can be partitioned into multiple smaller problems that can be solved in parallel. In one embodiment, the splitting can be done by first translating the circuit problem (e.g., the problem of finding a test suite with a minimum number of test patterns) into an equivalent Boolean formula and then converting the Boolean formula to a conjunctive normal form (CNF). The CNF can then be sent to a lookahead SAT solver to split the circuit into multiple subcircuits.

After splitting, each subcircuit can be converted to a formula in PUBO format (operation 508). Converting a circuit to a PUBO formula can include representing each logic gate with a polynomial. For example, a number of logic gates (e.g., AND, OR, XOR, XNOR, NOT) can be represented using corresponding polynomials according to Table 1. The system can then reduce the order of the PUBO formulas (operation 510). For example, the system can reduce the higher-order terms within the PUBO formulas to quadratic terms to obtain QUBO formulas. Note that converting a PUBO formula to a QUBO formula typically involves introducing ancillary variables. To reduce the number of added ancillary variables during order reduction, a lookahead technique similar to the one used during circuit splitting can be used to identify pairs of variables that can be replaced by an ancillary variable. Polynomials of a higher order (e.g., the third order) are also possible, depending on the implementation of the hardware solvers (e.g., whether it includes higher-order couplers).

The polynomials with the reduced order (e.g., QUBO formulas) can then be mapped to embeddable polynomials (operation 512). Note that mapping a QUBO formula to an embeddable QUBO formula can include solving a graph isomorphism problem. The embeddable QUBO formulas can then be embedded on the underlying hardware solvers (operation 514). The solution outputted by the hardware solvers can include the test suite having a minimum number of test patterns that can be used to test the physical circuit. Upon obtaining the solution, a circuit-testing system can use the test patterns as inputs to test the physical circuit. By comparing the output of the physical circuit responsive to a test pattern to the predetermined output (i.e., the output of the original, no-fault circuit responsive to the test pattern), the system can determine whether the physical circuit contains a fault. Moreover, the particular test pattern used as the circuit input can indicate the location and/or type of the fault. The test patterns included in the test suite can test all possible faults in the circuit.

In the example shown in FIG. 5, the process is used for generating a test suite for a to-be-tested circuit. It is also possible to use a similar process to design a circuit based on a set of circuit-design criteria (e.g., predetermined inputs and outputs). To solve the circuit-synthesis problem, during operation 504, instead of the fault-augmented test circuit, a miter structure comprising universal cells will be constructed.

Figure 6:
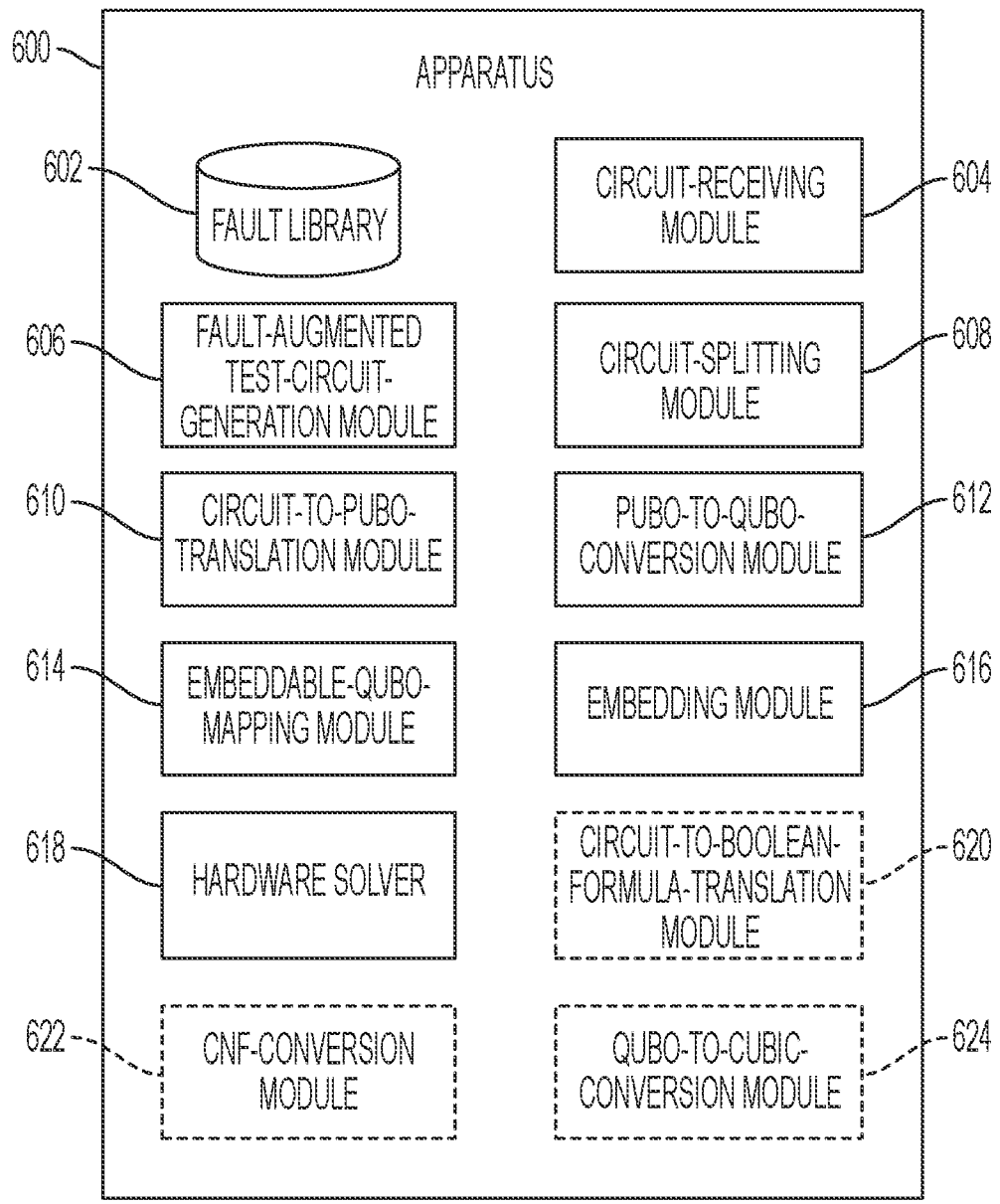
FIG. 6 illustrates an exemplary apparatus for solving circuit-diagnostic problems, according to one embodiment.

FIG. 6 illustrates an exemplary apparatus for solving the circuit-diagnostic problem, according to one embodiment. Apparatus 600 can include a fault library 602, a circuit-receiving module 604, a fault-augmented test-circuit-generation module 606, a circuit-splitting module 608, a circuit-to-PUBO-translation module 610, a PUBO-to-QUBO-conversion module 612, an embeddable-QUBO-mapping module 614, an embedding module 616, and a hardware solver 618. Apparatus 600 can also include a number of optional modules, such as an optional circuit-to-Boolean-formula-translation module 620, an optional CNF-conversion module 622, and an optional QUBO-to-cubic-conversion module 624.

Fault library 602 stores the fault-augmented subcircuits for various types of faults, including but not limited to: the stuck-at faults, the wrong-component-type faults, the bridging faults, and the open-wire faults. Circuit-receiving module 604 receives the original, no-fault circuit design. In some embodiments, circuit-receiving module 604 can receive the design (e.g., the layout) of the circuit, and the to-be-tested physical circuits are manufactured according to the design. In alternative embodiments, the received circuit design can be in the form of a netlist that includes a list of components in the circuit and a list of the nodes to which they are connected. In addition to a digital circuit, circuit-receiving module 604 can receive the design of a physical system or a computational system of a different type, such as a mechanical system, an analog circuit, an electro-optical system, an electro-mechanical system, a processor, a reversible computing circuit, a quantum circuit, an optical circuit, a quantum optical circuit, a computer program, etc. Depending on the type of physical system, the received design can have a different format. For example, for a mechanical or an optical system, the design can be a model (e.g., a mathematical model) of the system; and for a computer program, the design can be logic expressions. In addition, depending on the type of physical system being tested, fault library 602 can include different types of faults.

Fault-augmented test-circuit-generation module 606 can generate a test circuit based on the fault-emulating subcircuits included in fault library 602. In addition to inserting faults into the original circuit design, fault-augmented test-circuit-generation module 606 can also apply appropriate constraints (e.g., a cardinality constraint) to the test circuit. In one embodiment, instead of encoding the cardinality constraint using a sorting network, the constraint is encoded using a term $n^{-1}(f_1+f_2+ \ldots +f_n)$, where $f_1, f_2, \ldots, f_n$ is the set of all assumable variables. Circuit-splitting module 608 can split a large circuit (e.g., the fault-augmented test circuit) into multiple smaller subcircuits. In one embodiment, circuit-splitting module 608 can use the cube-and-conquer technique to divide a large circuit problem into multiple smaller circuit problems.

Circuit-to-PUBO-translation module 610 translates the circuit problem (e.g., the subcircuits) to PUBO format. For example, each subcircuit can be converted to a PUBO formula (e.g., a formula similar to the one shown in FIG. 2). PUBO formulas outputted by circuit-to-PUBO-translation module 610 can be sent to PUBO-to-QUBO-conversion module 612, which can reduce higher-order terms to quadratic terms by introducing ancillary variables. The variable selection process can use lookahead heuristics similar to the one used by circuit-splitting module 608. In one embodiment, the most frequently used variable pairs can be selected to be replaced by an ancillary variable.

Embeddable-QUBO-mapping module 614 can map QUBO formulas that cannot be directly embedded on hardware solver 618 to embeddable QUBO formulas. More specifically, the mapping can be done by solving a graph isomorphism problem. Embedding module 616 can embed the QUBO formula to hardware solver 618, which uses QUBO formula as the objective function to find the solution to the circuit problem. For a circuit-diagnosis problem, the solution can be a vector, containing a minimal-cardinality diagnosis. For a circuit-testing problem, the solution can be a test suite with the minimum number of test patterns or vectors. For a circuit-synthesis problem, the solution can include a circuit design meeting a set of design criteria. Hardware solver 618 can be based on quantum-computing devices, such as D-wave devices and Ising machines.

Optional circuit-to-Boolean-formula-translation module 620 can translate the circuit problem to an equivalent Boolean formula, and optional CNF-conversion module 622 can convert the Boolean formula to CNF format, thus allowing a conventional SAT solver (not shown in FIG. 6) to solve the circuit problem. Optional QUBO-to-cubic-conversion module 624 can convert the PUBO formulas to cubic unconstrained binary optimization (CUBO) formulas, which can make use of three-couplers in hardware solver 618. The CUBO formulas can provide a more compact representation of the PUBO formulas.

Figure 7:
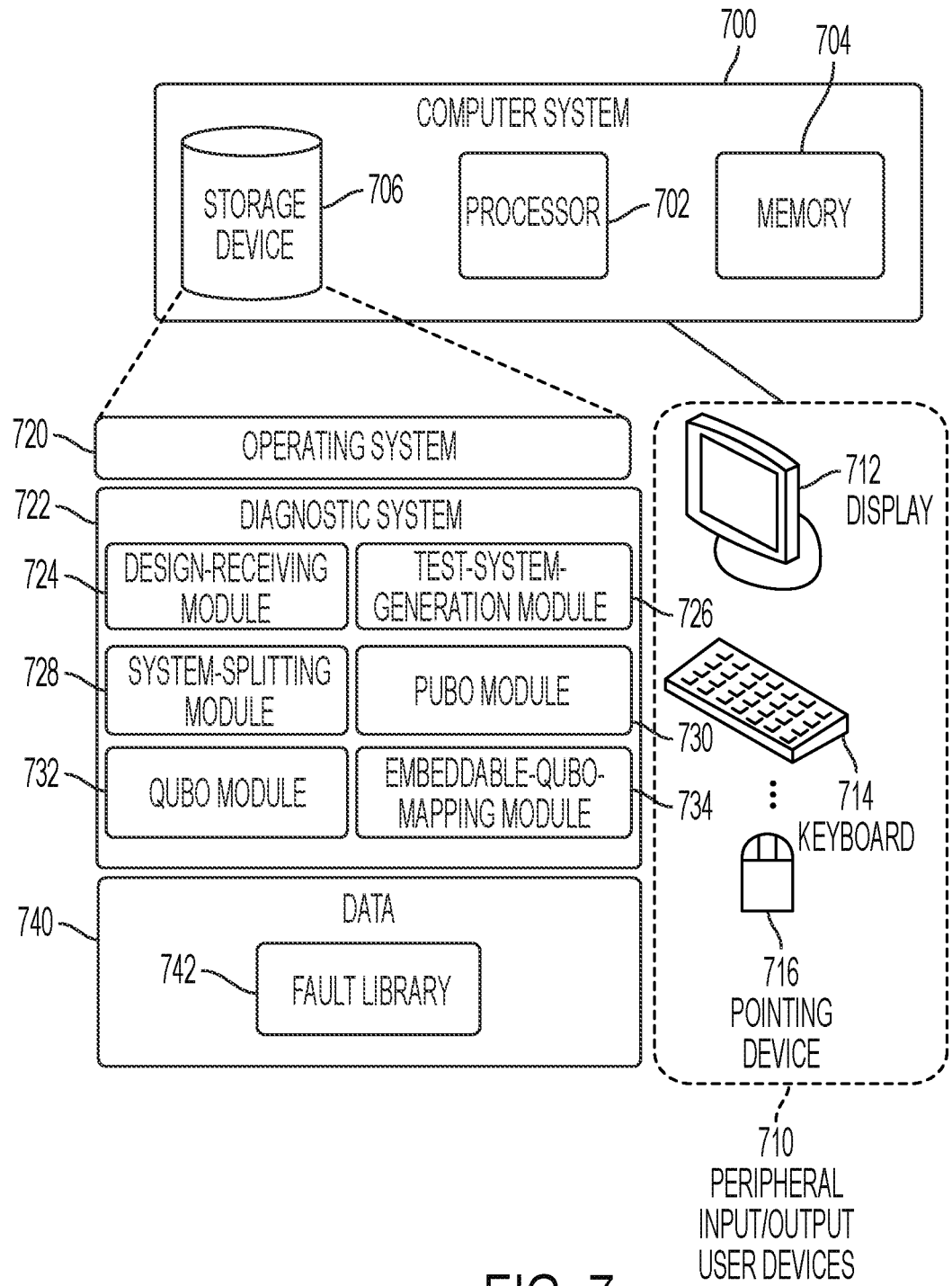
FIG. 7 illustrates an exemplary computer system that facilitates generating test patterns for diagnostics of physical systems, according to one embodiment.

FIG. 7 illustrates an exemplary computer system that facilitates generating test patterns for diagnostics of physical systems, according to one embodiment. Computer system 700 includes a processor 702, a memory 704, and a storage device 706. Furthermore, computer system 700 can be coupled to peripheral input/output (I/O) user devices 710, e.g., a display device 712, a keyboard 714, and a pointing device 716. Storage device 706 can store an operating system 720, a circuit-diagnostic system 722, and data 740.

Diagnostic system 722 can include instructions, which when executed by computer system 700, can cause computer system 700 or processor 702 to perform methods and/or processes described in this disclosure. Specifically, diagnostic system 722 can include instructions for receiving the original no-fault design of a physical system (design-receiving module 724), instructions for generating a test system (test-system-generation module 726), instructions for splitting the test system into smaller subsystems (system-splitting module 728), instructions for translating the system-diagnostic problem to PUBO format (PUBO module 730), instructions for converting the PUBO format to QUBO format by order reduction (QUBO module 732), instructions for mapping the QUBO formulas to embeddable QUBO formulas (embeddable-QUBO-mapping module 734). Data 740 can include a fault library 742.

In general, the disclosed embodiments can provide a system and method for solving large-scale combinatorial optimization problems, such as the circuit-testing-problem, the circuit-diagnosis problem, and the circuit-synthesis problem. More specifically, a hybrid platform that includes a modular software stack for reducing the combinatorial optimization problem to the problem of minimizing a system of multilinear polynomials and a hardware-based solver can be provided. The software stack can include a circuit-encoding module for constructing a circuit based on the to-be-solved problem. For the circuit-diagnostic problem, a test circuit can be constructed based on a number of fault-emulating subcircuits and the cardinality constraints (e.g., the single-fault constraint, the double-fault constraint, etc.). A circuit-synthesis problem can be encoded based on a miter structure, and the design problem can be solved by finding the solution of the circuit-SAT problem. The software stack can further include a module for splitting a large circuit into smaller subcircuits, a module for translating each subcircuit to a PUBO formula, a module for reducing the order of the PUBO formulas (i.e., to convert the PUBO formulas to QUBO formulas), and a module for mapping the QUBO formulas to embeddable QUBO formulas. The hardware-based solver can include quantum-computing-based devices, such as D-wave devices and Ising machines. Compared with existing approaches based on SAT solvers, the disclosed solution can provide higher computational efficiency and scalability.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed. When the hardware modules or apparatus are activated, they perform the methods and processes included within them.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for computing diagnostics for a to-be-diagnosed circuit, the method comprising:
    obtaining, by a computer, a design of the to-be-diagnosed circuit comprising a plurality of logic gates;
    generating a design of a diagnostic system by augmenting the design of the to-be-diagnosed circuit based on a number of fault-emulating subcircuits, wherein augmenting the design of the to-be-diagnosed circuit comprises inserting a fault-emulating subcircuit at an output of each logic gate within the to-be-diagnosed circuit, wherein the fault-emulating subcircuit comprises first and second assumable inputs for respectively emulating stuck-at-0 and stuck-at-1 faults;
    converting the design of the diagnostic circuit into a polynomial formula comprising a plurality of variables, wherein the plurality of variables comprise inputs and outputs of the circuit and a number of ancillary variables, wherein the inputs comprise the first and second assumable inputs of the fault-emulating subcircuits, and wherein the ancillary variables comprise outputs of logic gates within the diagnostic circuit; and
    embedding the polynomial formula on a hardware-based solver configured to perform optimization using the polynomial formula as an objective function to obtain a diagnostic vector used for explaining faults in the to-be-diagnosed circuit.

2. The method of claim 1, wherein converting the design of the diagnostic circuit into the polynomial formula comprises representing each logic gate using a corresponding polynomial.

3. The method of claim 1, further comprising splitting the diagnostic circuit into a plurality of subcircuits by implementing a cube-and-conquer technique, thereby facilitating parallel processing.

4. The method of claim 1, wherein converting the design of the diagnostic circuit comprises reducing an order of the polynomial formula to obtain a quadratic polynomial formula.

5. The method of claim 4, wherein reducing the order of the polynomial formula comprises:
   determining an occurrence frequency of a product of a k-tuple of variables selected from the plurality of variables, wherein k is an integer;
   determining a ranking of the k-tuple of variables based on the occurrence frequency of the product; and
   in response to determining that the ranking is higher than a predetermined ranking, introducing an additional ancillary variable to replace the product of the k-tuple of variables.

6. The method of claim 1, further comprising mapping the polynomial formula to a formula embeddable on the hardware-based solver, wherein mapping the polynomial formula to the embeddable formula comprises solving a graph isomorphism problem.

7. The method of claim 1, wherein the hardware-based solver comprises an Ising machine.

8. A non-transitory computer-readable storage medium storing instructions that when executed by a computer cause the computer to perform a method for generating test vectors for a to-be-tested circuit, the method comprising:
   obtaining a design of the to-be-tested circuit comprising a plurality of logic gates;
   generating a design of a test circuit by augmenting the design of the to-be-tested circuit based on a number of fault-emulating subcircuits, wherein augmenting the design of the to-be-tested circuit comprises inserting a fault-emulating subcircuit at an output of each logic gate within the to-be-tested circuit, wherein the fault-emulating subcircuit comprises first and second assumable inputs for respectively emulating stuck-at-0 and stuck-at-1 faults;
   converting the design of the test circuit into a polynomial formula comprising a plurality of variables, wherein the plurality of variables comprise inputs and outputs of the test circuit and a number of ancillary variables, wherein the inputs comprise the first and second assumable inputs of the fault-emulating subcircuits, and wherein the ancillary variables comprise outputs of logic gates within the test circuit; and
   embedding the polynomial formula on a hardware-based solver configured to perform optimization using the polynomial formula as an objective function to obtain the test vectors used for testing potential faults in the to-be-tested circuit.

9. The non-transitory computer-readable storage medium of claim 8, wherein converting the design of the test circuit into the polynomial formula comprises representing each logic gate using a corresponding polynomial.

10. The non-transitory computer-readable storage medium of claim 8, wherein the method further comprises splitting the test circuit into a plurality of subcircuits by implementing a cube-and-conquer technique, thereby facilitating parallel processing.

11. The non-transitory computer-readable storage medium of claim 8, wherein converting the design of the test circuit comprises reducing an order of the polynomial formula to obtain a quadratic polynomial formula.

12. The non-transitory computer-readable storage medium of claim 11, wherein reducing the order of the polynomial formula comprises:
   determining an occurrence frequency of a product of a k-tuple of variables selected from the plurality of variables, wherein k is an integer;
   determining a ranking of the k-tuple of variables based on the occurrence frequency of the product; and
   in response to determining that the ranking is higher than a predetermined ranking, introducing an additional ancillary variable to replace the product of the k-tuple of variables.

13. The non-transitory computer-readable storage medium of claim 8, wherein the method further comprises mapping the polynomial formula to a formula embeddable on the hardware-based solver, and wherein mapping the polynomial formula to the embeddable formula comprises solving a graph isomorphism problem.

14. The non-transitory computer-readable storage medium of claim 8, wherein the hardware-based solver comprises an Ising machine.

15. A computing system, comprising:
   a processor; and
   a memory coupled to the processor and storing instructions that when executed by the processor cause the processor to perform a method for computing diagnoses or generating test vectors for a digital circuit, the method comprising
   receiving a design of the digital circuit comprising a plurality of logic gates;
   generating a design of a fault-augmented diagnostic or test circuit by augmenting the design of the digital circuit based on a number of fault-emulating subcircuits, wherein augmenting the design of the digital circuit comprises inserting a fault-emulating subcircuit at an output of each logic gate within the digital circuit, wherein the fault-emulating subcircuit comprises first and second assumable inputs for respectively emulating stuck-at-0 and stuck-at-1 faults;
   converting the design of the fault-augmented diagnostic or test circuit into a polynomial formula comprising a plurality of variables, wherein the plurality of variables comprise inputs and outputs of the fault-augmented diagnostic or test circuit and a number of ancillary variables, wherein the inputs comprise the first and second assumable inputs of the fault-emulating subcircuits, and wherein the ancillary variables comprise outputs of logic gates within the fault-augmented diagnostic or test circuit; and
   embedding the polynomial formula on a hardware-based solver configured to perform optimization using the polynomial formula as an objective function to obtain a diagnostic vector used for explaining faults or the test vectors used for testing potential faults in the digital circuit.

16. The computing system of claim 15, wherein converting the design of the diagnostic or test circuit into the polynomial formula comprises representing each logic gate using a corresponding polynomial.

17. The computing system of claim 15, wherein converting the design of the diagnostic or test circuit into the polynomial formula comprises reducing an order of the polynomial formula to obtain a quadratic polynomial formula.

18. The computing system of claim 17, wherein reducing the order of the polynomial formula comprises:
- determining an occurrence frequency of a product of a k-tuple of variables selected from the plurality of variables, wherein k is an integer;
- determining a ranking of the k-tuple of variables based on the occurrence frequency of the product; and
- in response to determining that the ranking is higher than a predetermined ranking, introducing an additional ancillary variable to replace the product of the k-tuple of variables.

19. The computing system of claim 15, wherein the method further comprises mapping the polynomial formula to a formula embeddable on the hardware-based solver, and wherein mapping the polynomial formula to the embeddable formula comprises solving a graph isomorphism problem.

20. The computing system of claim 15, wherein the hardware-based solver comprises an Ising machine.

* * * * *